(12) United States Patent
Tu

(10) Patent No.: US 11,410,856 B2
(45) Date of Patent: Aug. 9, 2022

(54) CHIP PACKAGING METHOD

(71) Applicant: LINGSEN PRECISION INDUSTRIES, LTD., Taichung (TW)

(72) Inventor: Ming-Te Tu, Taichung (TW)

(73) Assignee: LINGSEN PRECISION INDUSTRIES, LTD., Taichung (TW)

(*) Notice: Subject to any disclaimer, the term of this patent is extended or adjusted under 35 U.S.C. 154(b) by 58 days.

(21) Appl. No.: 17/109,540

(22) Filed: Dec. 2, 2020

(65) Prior Publication Data
US 2022/0148887 A1 May 12, 2022

(30) Foreign Application Priority Data
Nov. 10, 2020 (TW) ................. 109139220

(51) Int. Cl.
*H01L 21/56* (2006.01)
*H01L 21/768* (2006.01)
*H01L 21/60* (2006.01)

(52) U.S. Cl.
CPC ........ *H01L 21/56* (2013.01); *H01L 21/76802* (2013.01); *H01L 2021/6027* (2013.01)

(58) Field of Classification Search
CPC ..... H01L 21/78–7806; H01L 21/76802; H01L 21/56; H01L 23/31–3121
See application file for complete search history.

(56) References Cited

U.S. PATENT DOCUMENTS

| | | | | |
|---|---|---|---|---|
| 6,008,070 A | * | 12/1999 | Farnworth | H01L 24/97 438/110 |
| 6,582,991 B1 | * | 6/2003 | Maeda | H01L 24/81 257/E21.705 |
| 7,633,765 B1 | * | 12/2009 | Scanlan | H01L 23/5389 174/262 |
| 7,671,457 B1 | * | 3/2010 | Hiner | H05K 7/1061 257/781 |
| 9,812,386 B1 | * | 11/2017 | Huemoeller | H01L 23/5389 |
| 2009/0102002 A1 | * | 4/2009 | Chia | H01L 27/14618 257/E31.113 |
| 2010/0289133 A1 | * | 11/2010 | Chao | H01L 23/49816 257/E23.06 |
| 2012/0032340 A1 | * | 2/2012 | Choi | H01L 21/561 257/777 |
| 2012/0286415 A1 | * | 11/2012 | Sakai | H01L 25/0655 257/734 |
| 2012/0306097 A1 | * | 12/2012 | Kim | H01L 24/97 257/774 |

(Continued)

*Primary Examiner* — Bac H Au
(74) *Attorney, Agent, or Firm* — Muncy, Geissler, Olds & Lowe, P C.

(57) ABSTRACT

A chip packaging method begins by fixing a chip to the top side of a substrate. The chip is then encapsulated in an encapsulant. After that, the encapsulant is drilled from its top side in order to have a through hole adjacent to the chip. Lastly, an area extending between the chip and the through hole and the hole wall of the through hole are plated with an electrically conductive metal to enable electrical connection between the chip and the substrate through the electrically conductive metal. The chip packaging method solves the problems of the conventional wire bonding method, simplifies the packaging process, and provides the packaged chips with high transmission efficiency.

3 Claims, 7 Drawing Sheets

(56) References Cited

U.S. PATENT DOCUMENTS

| | | | |
|---|---|---|---|
| 2013/0164867 A1* | 6/2013 | Ramasamy | H01L 24/19 |
| | | | 257/E33.059 |
| 2014/0077366 A1* | 3/2014 | Kim | H01L 24/19 |
| | | | 257/737 |
| 2016/0276235 A1* | 9/2016 | Chen | H01L 24/24 |
| 2016/0307872 A1* | 10/2016 | Chen | H01L 21/565 |
| 2017/0110413 A1* | 4/2017 | Chen | H01L 23/3107 |
| 2017/0154881 A1* | 6/2017 | Shao | H01L 21/76877 |
| 2018/0040578 A1* | 2/2018 | Yu | H01L 23/3185 |
| 2018/0076148 A1* | 3/2018 | Nguyen | H01L 23/49811 |
| 2018/0114786 A1* | 4/2018 | Hsu | H01L 23/3128 |
| 2018/0261573 A1* | 9/2018 | Chen | H01L 21/6835 |
| 2019/0318986 A1* | 10/2019 | Yu | H01L 22/14 |
| 2019/0333862 A1* | 10/2019 | Wang | H01L 23/544 |
| 2020/0251454 A1* | 8/2020 | Shih | H01L 24/20 |

* cited by examiner

CHIP PACKAGING METHOD

BACKGROUND OF TILE INVENTION

1. Field of the Invention

The present invention relates to a method for packaging a monolithic integrated circuit, or chip. More particularly, the invention relates to a chip packaging method that can simplify the packaging process and enhance the transmission efficiency of the packaged chips.

2. Description of the Related Art

A conventional chip packaging process typically involves fixing a chip adhesively to a substrate, connecting the chip and the substrate with a plurality of metal wires to establish an electrical connection between the chip and the substrate, and then encapsulating the chip in an encapsulant (e.g., epoxy resin) to complete the packaging process.

Connecting the chip and the substrate with the metal wires (generally known as wire bonding) is a relatively complicated step of the packaging process. Moreover, the lengths of the metal wires not only lead to relatively long transmission paths and thus compromise chip performance, but also may hinder the resulting chip package structure from meeting its dimensional requirements and thus reduce the competitive edge of the chip package structure when it comes to application to an end product.

SUMMARY OF THE INVENTION

The primary objective of the present invention is to provide a chip packaging method that can simplify the packaging process and enhance the transmission efficiency of the packaged chips.

To achieve the primary objective stated above, the chip packaging method of the present invention includes the steps of: fixing a chip to the top side of a substrate; encapsulating the chip in an encapsulant; drilling the encapsulant from its top side in order tor the encapsulant to have a first through hole adjacent to the chip; and plating the hole wall of the first through hole as well as an area extending between the top side of the chip and the top end of the first through hole with a layer of electrically conductive metal to enable electrical connection between the chip and the substrate through the electrically conductive metal.

It can be known from the above that the chip packaging method of the present invention uses the electrically conductive metal layer instead of metal wires to electrically connect the chip and the substrate. Consequently, the various problems caused by the conventional wire bonding method are solved, the packaging process simplified, and the transmission efficiency of the resulting chip package structure enhanced.

Preferably, the substrate is used on both sides to increase substrate utilization. That is to say, the foregoing steps can be used to provide each of the top side and the bottom side of the substrate with at least one chip, a layer of encapsulant, at least one first through hole, and the corresponding electrically conductive metal plating, before the substrate is cut through the middle to form an upper part and a lower part. The upper part and the lower part are then severed according to the number of chips to produce a plurality of chip package structures. This two-sided approach can make the packaging process more efficient.

Preferably, the first through hole extends through the encapsulant and the substrate, the substrate is drilled from its bottom side and therefore has a second through hole adjacent to the chip, and the hole wall of the second through hole is plated with the electrically conductive metal along with an area that extends between the bottom side of the substrate and the bottom end of the first through hole and an area that extends between the bottom side of the substrate and the bottom end of the second through hole, so that the resulting chip package structure need not be rotated vertically by 180 degrees in order to be electrically connected to a printed circuit board. This alternative configuration increases the convenience of use of the chip package structure.

The details, features, and assembly or use method of or involved in the chip packaging method of the present invention will be described at greater length below in the DETAILED DESCRIPTION OF THE INVENTION section. As a person of ordinary skill in the art would understand, the detailed description and the specific embodiments provided therein serve only to expound the invention and are not intended to be restrictive of the scope of the invention.

DETAILED DESCRIPTION OF THE INVENTION

Figure 1A:
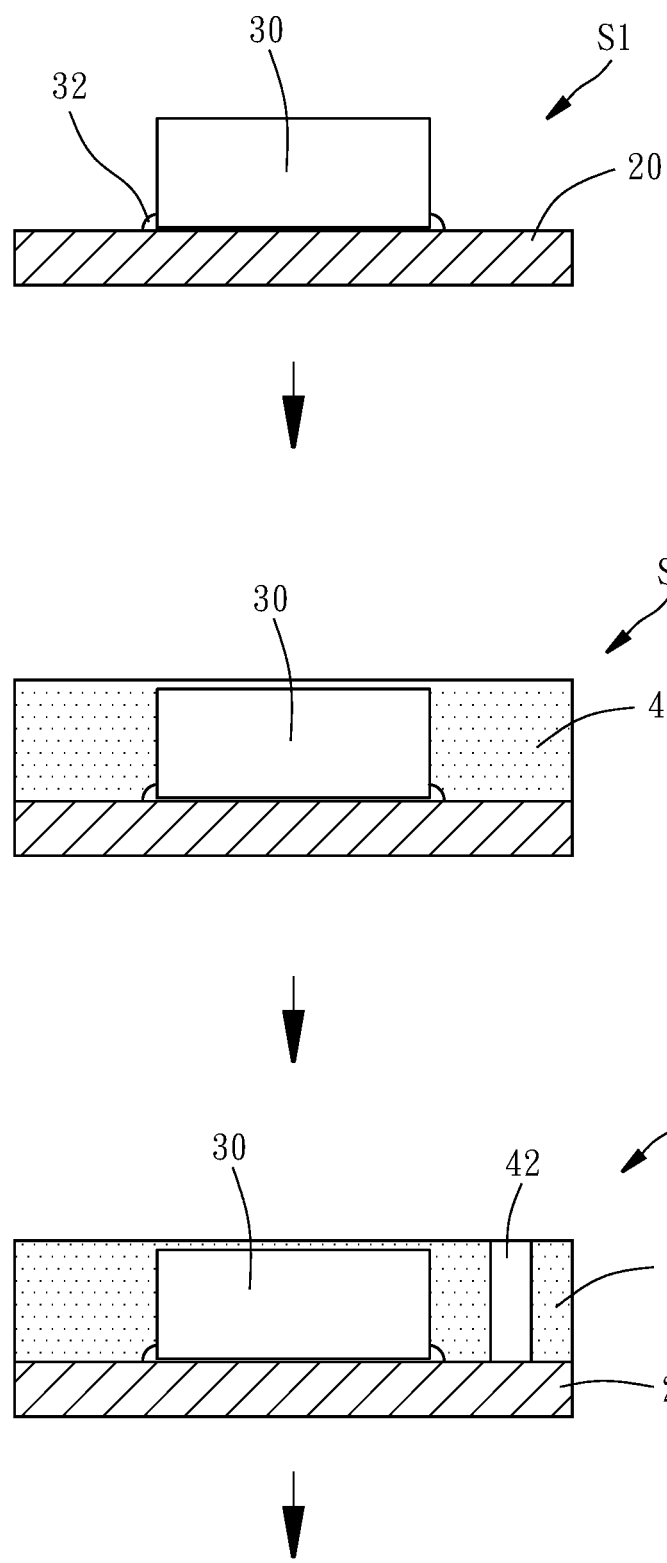
FIG. 1A and FIG. 1B show the process flow of the chip packaging method according to the first embodiment of the present invention.

To begin with, the applicant wishes to point out that throughout this specification (including the embodiments described below) and the appended claims, all the directional terms are based on the directions presented in the accompanying drawings. Furthermore, in the following embodiments and the drawings, the same or similar elements or structural features are identified by the same reference numeral.

Figure 1B:
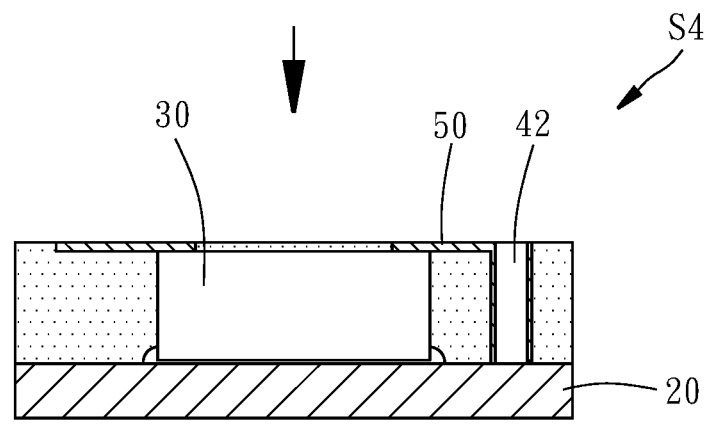
Figure 1B:
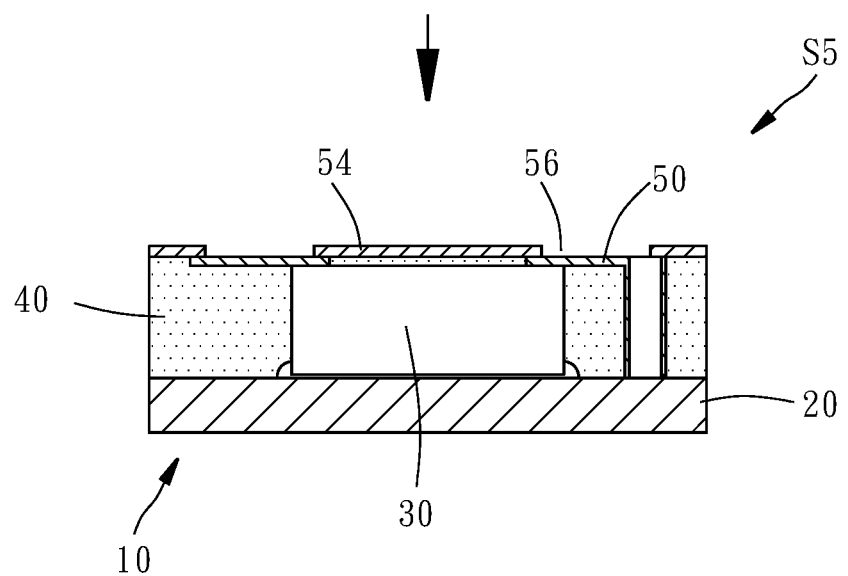

Referring to FIG. 1A and FIG. 1B, the chip packaging method according to the first embodiment of the present invention includes the following steps:

a) As indicated as step S1 in FIG. 1A, a chip 30 is fixed on the top side of a substrate 20 via an adhesive 32. The substrate 20 functions as a bridge between the chip 30 and a printed circuit board (not shown) and provides heat dissipation as well as circuit protection.

b) As indicated as step S2 in FIG. 1A, the chip 30 is encapsulated in, and thus protected by, a layer of encapsulant 40 (e.g., epoxy resin).

c) As indicated as step S3 in FIG. 1A, a hole is drilled downward into the encapsulant 40 from the top side of the encapsulant 40 such that the encapsulant 40 has a first through hole 42 adjacent to the chip 30. The first through hole 42 extends through the top side and the bottom side of the encapsulant 40.

d) As indicated as step S4 in FIG. 1B, the hole wall of the first through hole 42 as well as an area extending between the top side of the chip 30 and the top end of the first through hole 42 is plated with a layer of electrically conductive metal 50 (e.g., copper) to enable electrical connection between the chip 30 and the substrate 20 through the electrically conductive metal 50. The electrically conductive metal 50 in the area extending between the top side of the chip 30 and the top end of the first through hole 42 covers a portion of the encapsulant 40.

e) As indicated as step S5 in FIG. 1B, a layer of solder mask 54 is provided on the top side of the encapsulant 40 to protect the electrically conductive metal 50. The solder mask 54 has an opening 56 through which the electrically conductive metal 50 is partially exposed, so the chip 30 can be electrically connected to a printed circuit board (not shown) through the exposed portion of the electrically conductive metal 50.

According to the above, the chip packaging method of the present invention is so designed that the first through hole 42 works in conjunction with the electrically conductive metal 50 to establish an electrical connection between the chip 30 and the substrate 20, and that the entire packaging process makes no use of metal wires. Consequently, problems resulting from the conventional wire bonding method are solved, the packaging process is simplified, and the transmission efficiency of the resulting chip package structure is enhanced.

Figure 2A:
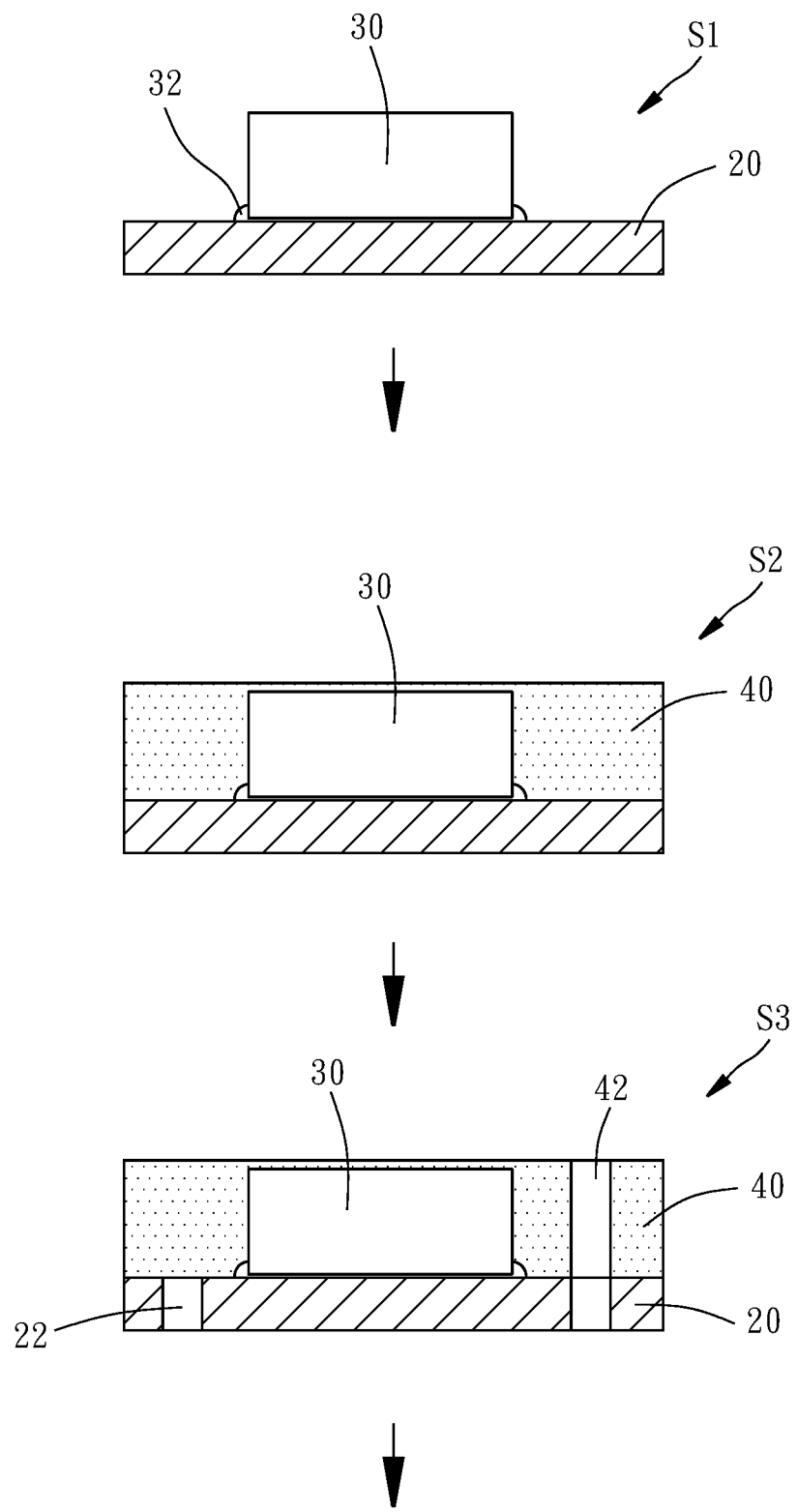
FIG. 2A and FIG. 2B show the process flow of the chip packaging method according to the second embodiment of the invention.
Figure 2B:
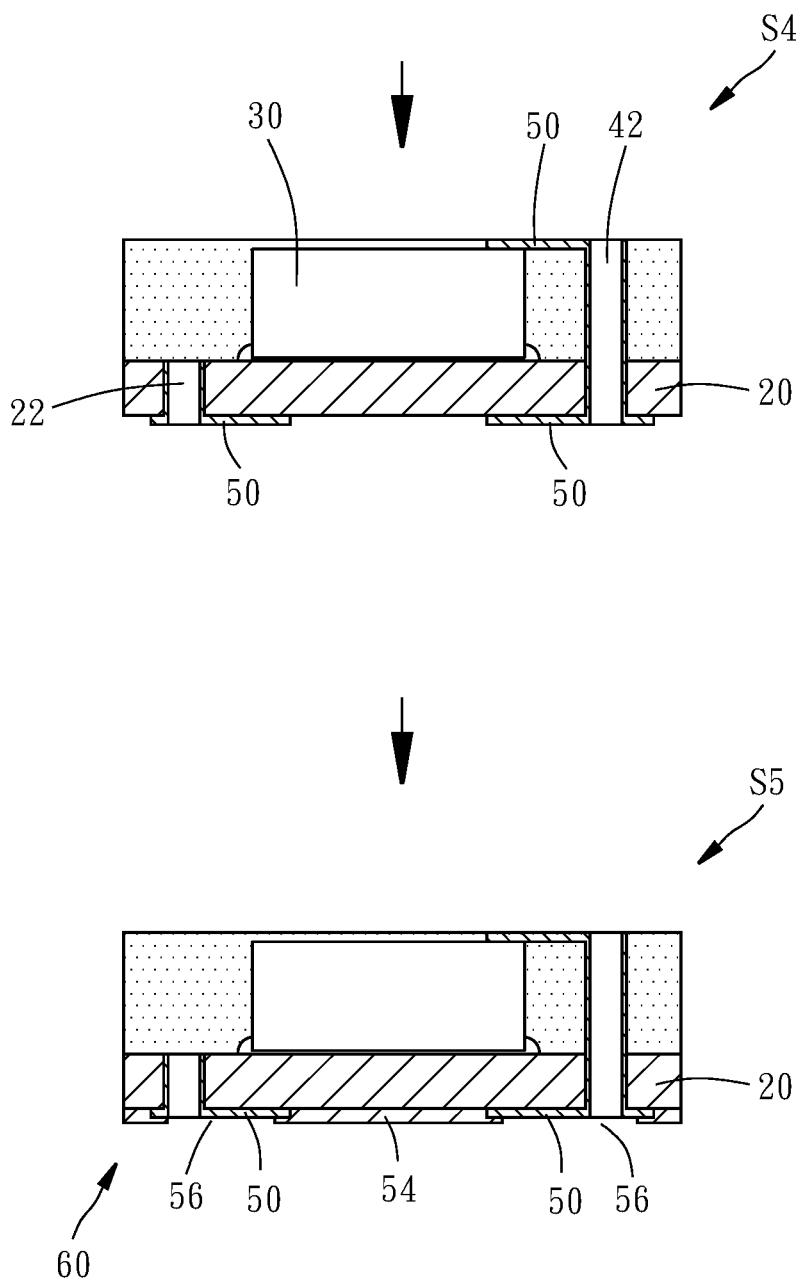

FIG. 2A and FIG. 2B show the chip packaging method according to the second embodiment of the present invention. This embodiment is generally the same as the first embodiment, the main difference being that the chip package structure 60 formed by the chip packaging method according to the second embodiment has the electrically conductive metal 50 below as well as on the top side of the chip 30 and therefore need not be rotated vertically by 180 degrees in order to be electrically connected to a printed circuit board, as is typically the case with the chip package structure 10 formed by the chip packaging method according to the first embodiment, in which the electrically conductive metal 50 is provided only on the top side of the chip 30. More specifically, the chip packaging method according to the second embodiment includes the following steps:

a) As indicated as step S1 in FIG. 2A, a chip 30 is fixed on the top side of a substrate 20 via an adhesive 32.

b) As indicated as step S2 in FIG. 2A, the chip 30 is encapsulated in, and thus protected by, an encapsulant 40 (e.g., epoxy resin).

c) As indicated as step S3 in FIG. 2A, a hole is drilled downward into the encapsulant 40 from the top side of the encapsulant 40 such that the encapsulant 40 has a first through hole 42 adjacent to the chip 30. The first through hole 42 extends through not only the top side and the bottom side of the encapsulant 40, but also the top side and the bottom side of the substrate 20. In addition, a hole is drilled upward into the substrate 20 from the bottom side of the substrate 20 such that the substrate 20 has a second through hole 22 adjacent to the chip 30. The second through hole 22 extends through the top side and the bottom side of the substrate 20.

d) As indicated as step S4 in FIG. 2B, an area extending between the top side of the chip 30 and the top end of the first through hole 42, the hole wall of the first through hole 42, an area extending between the bottom side of the substrate 20 and the bottom end of the second through hole 22 and the hole wall of the second through hole 22 are plated with a layer of electrically conductive metal 50 (e.g., copper) to, on the one hand, connect the circuit on the top side of the chip 30 to the bottom side of the substrate 20 through the first through hole 42, whose hole wall is plated with the electrically conductive metal 50, and, on the other hand, provide grounding protection to the chip 30 through the second through hole 22, whose hole wall is also plated with the electrically conductive metal 50.

e) As indicated as step S5 in FIG. 2B, a solder mask 54 is provided on the bottom side of the substrate 20 to protect the electrically conductive metal 50 The solder mask 54 has an opening 56 through which the electrically conductive metal 50 on the bottom side of the substrate 20 is partially exposed. The exposed portion of the electrically conductive metal 50 on the bottom side of the substrate 20 may further receive an anti-oxidation treatment (e.g., plating with gold).

According to the above, the chip packaging method according to the second embodiment of the present invention allows the resulting chip package structure 60 to be electrically connected to a printed circuit board (not shown) through the exposed portion of the electrically conductive metal 50 on the bottom side of the substrate 20, without having to be rotated vertically by 180 degrees. The chip package structure 60, therefore, features greater convenience of use.

Figure 3A:
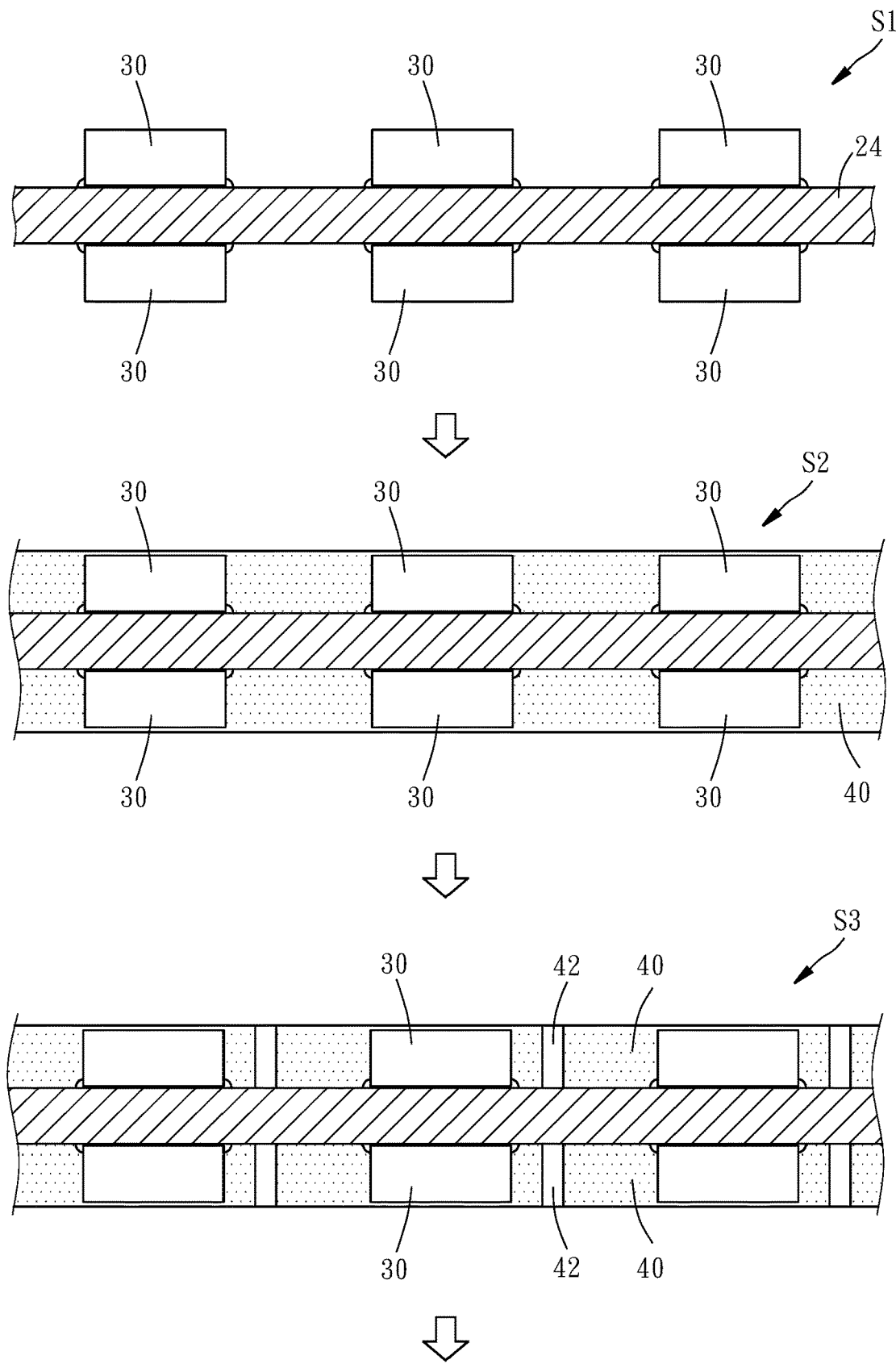
FIG. 3A to FIG. 3C show the process flow of the chip packaging method according to the third embodiment of the invention.
Figure 3B:
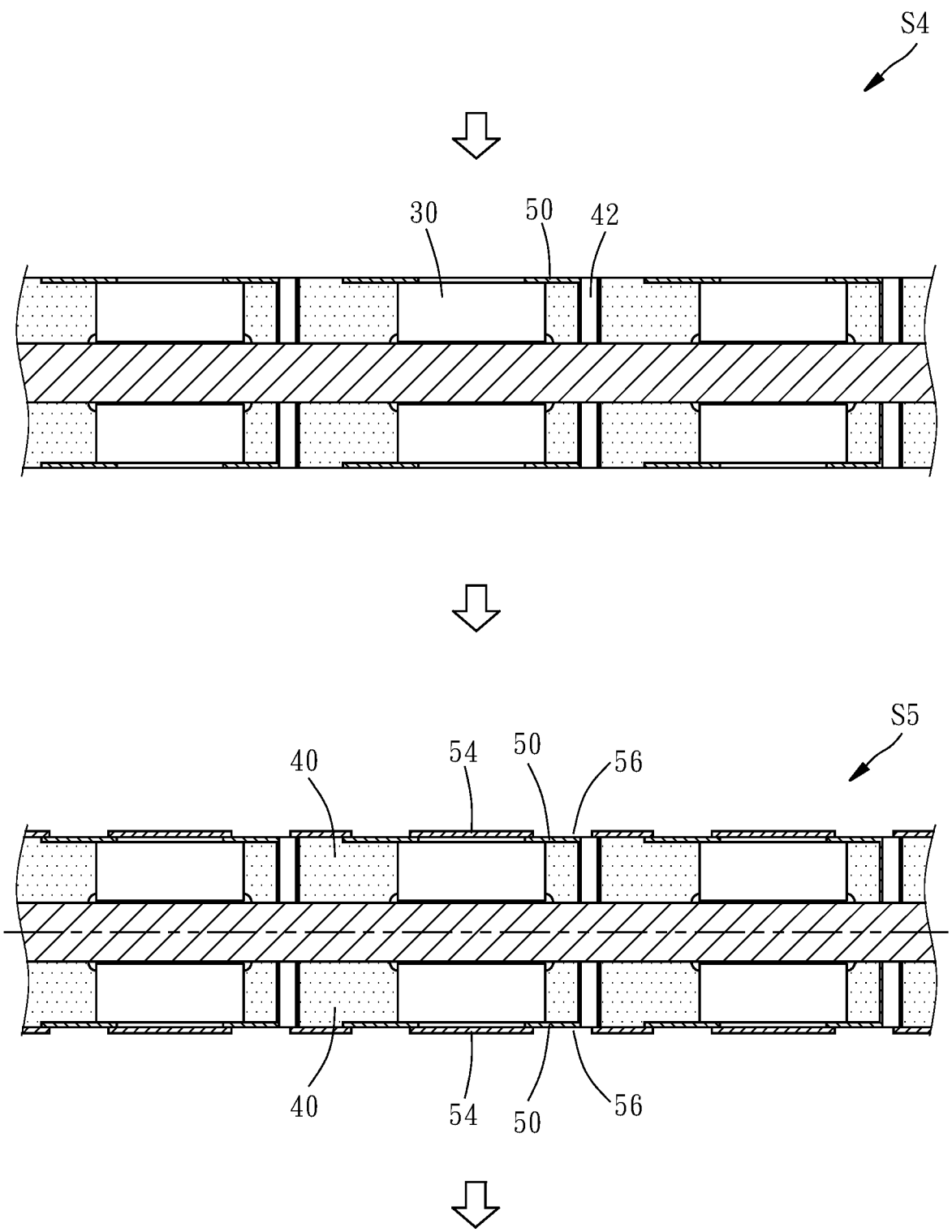
Figure 3C:
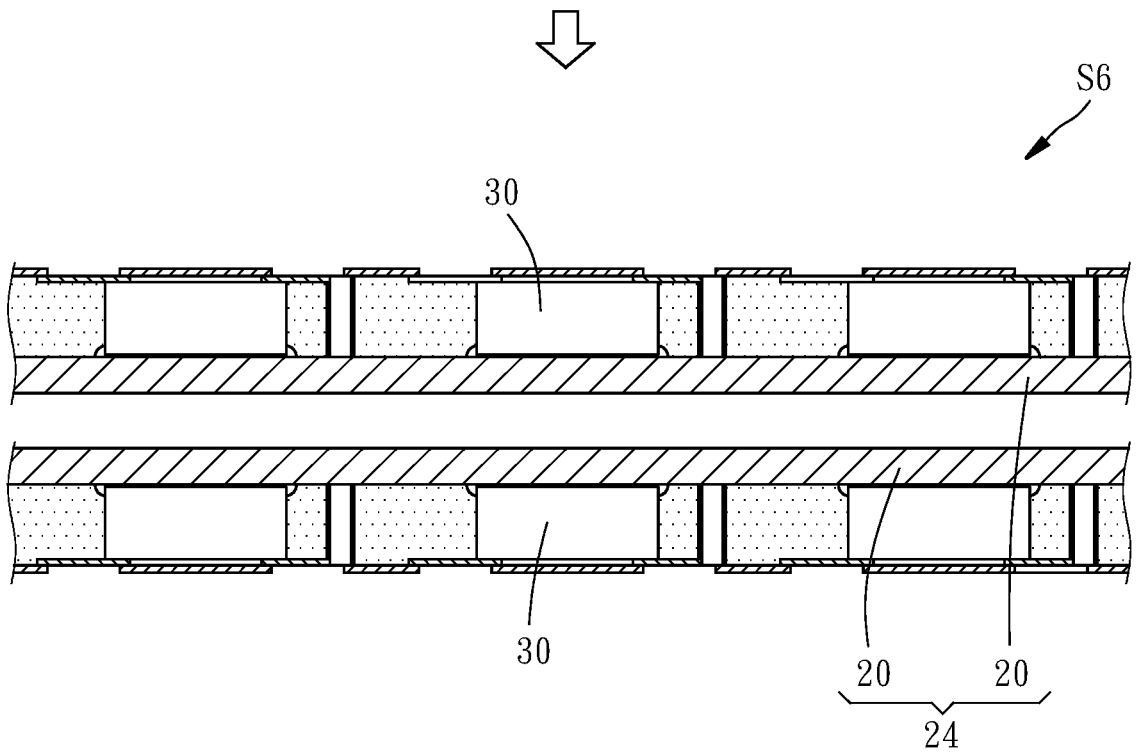
Figure 3C:
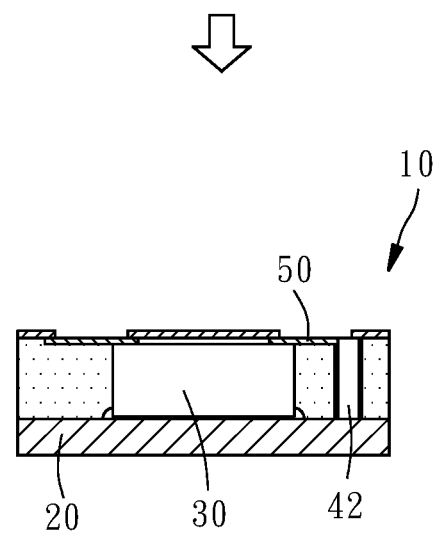

FIG. 3A to FIG. 3C shows the chip packaging method according to the third embodiment of the present invention. The third embodiment is generally the same as the first embodiment, the main difference being that unlike the first embodiment, whose packaging process is performed on only one side of the substrate 24, the third embodiment carries out the chip packaging method of the first embodiment on two sides of the substrate 24 at the same time to increase the utilization of the substrate 24 and the efficiency of the packaging process. More specifically, the chip packaging method according to the third embodiment includes the following steps:

a) As indicated as step S1 in FIG. 3A, a plurality of chips 30 are fixed on the top side and the bottom side of the substrate 24 via an adhesive 32 such that the chips 30 on the top side correspond in position to those on the bottom side respectively. To facilitate description, three chips 30 are provided on each of the top side and the bottom side of the substrate 24 by way of example.

b) As indicated as step S2 in FIG. 3A, the chips 30 on the top side and the bottom side of the substrate 24 are encapsulated in, and thus protected by, an upper layer and a lower layer of encapsulant 40 (e.g., epoxy resin) respectively.

c) As indicated as step S3 in FIG. 3A, a plurality of holes are drilled into each of the upper layer and the lower layer of encapsulant 40 such that each layer of encapsulant 40 has a plurality of first through holes 42. Each first through hole 42 is adjacent to one of the chips 30.

d) As indicated as step S4 in FIG. 3B, an area extending between the top side of each chip 30 and the top end of the adjacent first through hole 42 and the hole wall of each first through hole 42 are plated with a layer of electrically conductive metal 50 (e.g., copper) to enable electrical connection between each chip 30 and the corresponding substrate 20 (see FIG. 3C) through the corresponding layer of electrically conductive metal 50.

e) As indicated as step S5 in FIG. 3B, a solder mask 54 is provided on the bottom side of the lower layer of encapsulant 40 as well as the top side of the upper layer of encapsulant 40 to protect the electrically conductive metal 50. Each of the upper solder mask 54 and the lower solder mask 54 has a plurality of openings 56, and each opening 56 corresponds in position to an electrically conductive metal 50-plated portion and allows partial exposure of the electrically conductive metal 50-plated portion.

f) As indicated as step S6 in FIG. 3C, the substrate 24 is cut through the middle to form two separate parts, namely an upper part and a lower part. Each part is subsequently severed according to the number of chips 30 thereon to produce a plurality of chip package structures 10.

According to the above, the chip packaging method according to the third embodiment of the present invention not only increases the utilization of the substrate 24, but also can produce multiple chip package structures 10 in one go to make the packaging process highly efficient.

What is claimed is:

1. A chip packaging method, comprising the steps of:
   a) fixing two chips to a top side and a bottom side of a substrate respectively;
   b) encapsulating each said chip in a layer of encapsulant;
   c) drilling each said layer of encapsulant such that each said layer of encapsulant has a first through hole adjacent to a corresponding said chip;
   d) plating with an electrically conductive metal an area extending between each said chip and the adjacent first through hole and a hole wall of each said first through hole such that the chips are electrically connected to the substrate through the electrically conductive metal; and
   e) cutting the substrate through a middle portion thereof to form an upper part and a lower part.

2. The chip packaging method of claim 1, further comprising the step, to be performed between the step d) and the step e), of providing a solder mask on a surface of each said layer of encapsulant, wherein each said solder mask has an opening to allow partial exposure of the electrically conductive metal.

3. The chip packaging method of claim 1, wherein the first through hole in each said layer of encapsulant extends through a top side and a bottom side of the each said layer of encapsulant.

* * * * *